(12) United States Patent
Skerritt et al.

(10) Patent No.: US 6,646,430 B1
(45) Date of Patent: Nov. 11, 2003

(54) CURRENT MEASURING SHUNT WITH CIRCUITRY MOUNTED THEREON

(75) Inventors: Robert Charles Skerritt, Conwy (GB); Mark David Crosier, Isle of Anglesey (GB); Martin Anthony Murray, Bangor (GB); Brian Martin Reeder, Isle of Anglesey (GB)

(73) Assignee: Delta Electrical Limited, London (GB)

( * ) Notice: Subject to any disclaimer, the term of this patent is extended or adjusted under 35 U.S.C. 154(b) by 0 days.

(21) Appl. No.: 09/720,683

(22) PCT Filed: Jun. 30, 1999

(86) PCT No.: PCT/GB99/02053

§ 371 (c)(1),
(2), (4) Date: Dec. 27, 2000

(87) PCT Pub. No.: WO00/00833

PCT Pub. Date: Jan. 6, 2000

(30) Foreign Application Priority Data

Jun. 30, 1998 (GB) ................................................ 9813982

(51) Int. Cl.⁷ .......................... G01R 1/14; G01R 1/02; G01R 31/00; G06F 19/00
(52) U.S. Cl. ...................... 324/126; 324/96; 324/99 D; 702/60
(58) Field of Search ................................ 324/421, 424, 324/127, 142, 128, 117 H, 126, 99 D; 361/87, 85, 42, 44, 45; 327/513, 262; 702/60; 341/155; 338/49

(56) References Cited

U.S. PATENT DOCUMENTS

| | | | | |
|---|---|---|---|---|
| 1,257,514 A | * | 2/1918 | Meyer | 324/115 |
| 1,807,852 A | * | 6/1931 | MacGahan | 324/126 |
| 3,428,896 A | * | 2/1969 | Schweitzer | 324/126 |
| 4,009,477 A | * | 2/1977 | Rozylowicz | 324/95 |
| 4,823,075 A | * | 4/1989 | Alley | 324/117 H |
| 4,922,606 A | * | 5/1990 | Alexander et al. | 29/839 |
| 5,041,780 A | * | 8/1991 | Ripple | 324/117 H |
| 5,083,081 A | * | 1/1992 | Barrault et al. | 324/126 |
| 5,287,107 A | * | 2/1994 | Gampell et al. | 341/137 |
| 5,426,416 A | * | 6/1995 | Jefferies et al. | 340/664 |
| 5,436,858 A | * | 7/1995 | Staver | 364/724.1 |
| 5,463,569 A | * | 10/1995 | Staver et al. | 364/724.1 |
| 5,483,173 A | * | 1/1996 | Pellegrini | 324/765 |
| 5,589,766 A | * | 12/1996 | Frank et al. | 324/158.1 |
| 5,650,951 A | * | 7/1997 | Staver | 364/724.1 |
| 5,677,845 A | * | 10/1997 | Staver et al. | 364/483 |
| 5,701,253 A | | 12/1997 | Mayell et al. | 702/60 |
| 5,867,054 A | | 2/1999 | Kotowski | 327/513 |
| 5,875,087 A | | 2/1999 | Spencer et al. | 361/87 |
| 5,929,609 A | * | 7/1999 | Joy et al. | 322/25 |
| 6,023,160 A | * | 2/2000 | Coburn | 324/142 |
| 6,034,521 A | * | 3/2000 | Eckardt | 324/96 |
| 6,058,354 A | * | 5/2000 | Adame et al. | 702/60 |
| 6,233,532 B1 | * | 5/2001 | Boudreau et al. | 702/89 |

FOREIGN PATENT DOCUMENTS

| | | |
|---|---|---|
| EP | 0445048 | 2/1991 |
| EP | 0612081 | 2/1994 |
| EP | 0848258 | 12/1997 |
| GB | 2318002 | 8/1998 |

* cited by examiner

Primary Examiner—Christine K. Oda
Assistant Examiner—Wasseem H. Hamdan
(74) Attorney, Agent, or Firm—Amster, Rothstein & Ebenstein

(57) ABSTRACT

A current sensor which has a rigid metallic link member having two end portions of conductive material and an intermediate portion of resistive material interconnecting the end portions. An integrated circuit analog to digital converter is mounted on the link member. The converter has analog input terminals for connection to respective ones of the two end portions of the link member and digital output terminals for connection to a processing apparatus.

9 Claims, 2 Drawing Sheets

CURRENT MEASURING SHUNT WITH CIRCUITRY MOUNTED THEREON

This invention relates to a current sensor intended for use in an electrical apparatus such as a residual current detection device, a current meter or a power meter.

BACKGROUND OF THE INVENTION

It is an object of the present invention to provide a current sensor in an economical form.

SUMMARY OF THE INVENTION

In accordance with the invention there is provided a current sensor comprising a metallic link member having two end portions of conductive material and an intermediate portion interconnecting the end portions, said intermediate portion being formed of a resistive material, and an integrated circuit analog to digital converter mounted on said link member, said converter having analog input terminals connected to respective ones of said two end portions and digital output terminals for connection to a processing apparatus.

Conveniently, the converter is attached to the intermediate portion by a layer of electrically insulative adhesive material and the analog input terminals of the converter are connected to the end portions by wire bonds.

The converter preferably includes a delta-sigma modulator which provides a high frequency one-bit digital data. One or more decimation filtering stages may be included in the converter.

The converter may also have a voltage reference terminal for connection to a reference voltage source, the converter operating to provide digital output signals respectively representing the current flowing through said intermediate portion and digital output signals representing the voltage on one of said end portions.

DETAILED DESCRIPTION OF THE PREFERRED EMBODIMENTS

Figure 1:
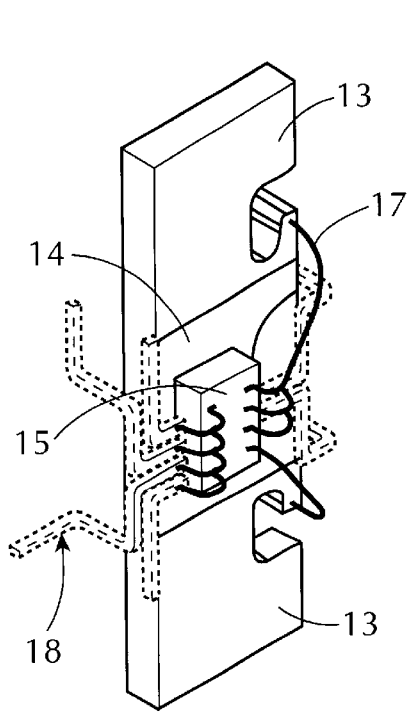
FIG. 1 is a perspective view of one example of a current detector in accordance with the invention, FIG. 2 a sectional view of the detector.
Figure 2:
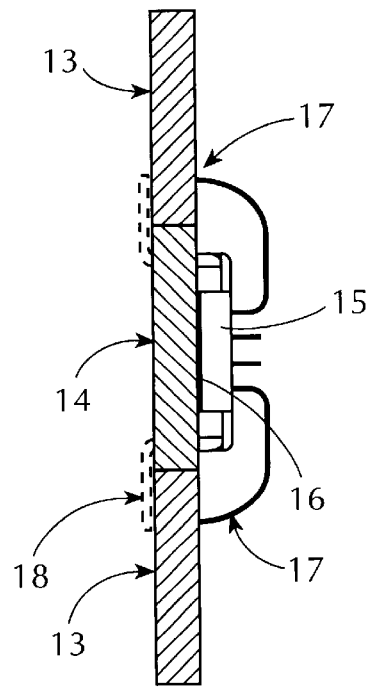
Figure 3:
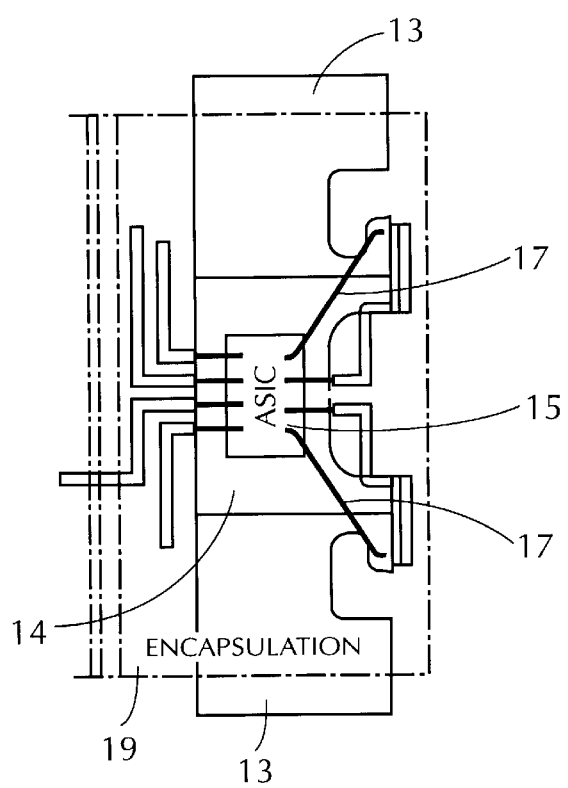
FIG. 3 is an elevation of the detector.

The detector shown in FIGS. 1 to 3 includes a rigid composite conductor strip having two end portions 13 of copper and an intermediate portion 14 of a resistive material such as manganin. The strips are formed by slicing up a sandwich formed by electron beam welding of the copper bars to opposite sides of a manganin bar. The shunts formed by the resistive portions 14 manufactured by this method may have a nominal resistance of 0.2 mΩ to a tolerance of less than 5%. The resistance of adjacent slices from the sandwich may differ by as little as 2%.

A signal pre-processing ASIC 15 is mounted on the manganin portion 14 by means of a layer of electrically insulating adhesive 16. Wire leads 17 connect two analog input terminals of the ASIC to respective ones of the copper end portions 13. Further leads connect terminals on the ASIC to conductors of a lead frame 18 parts of which are shown. As shown in FIG. 3 the ASIC, the manganin portion, the wire leads and the lead frame conductors are all enclosed within a block 19 of electrically insulating encapsulation material for the protection thereof. Opposite ends of the copper end portions 13 project from the encapsulation block 19.

Figure 4:
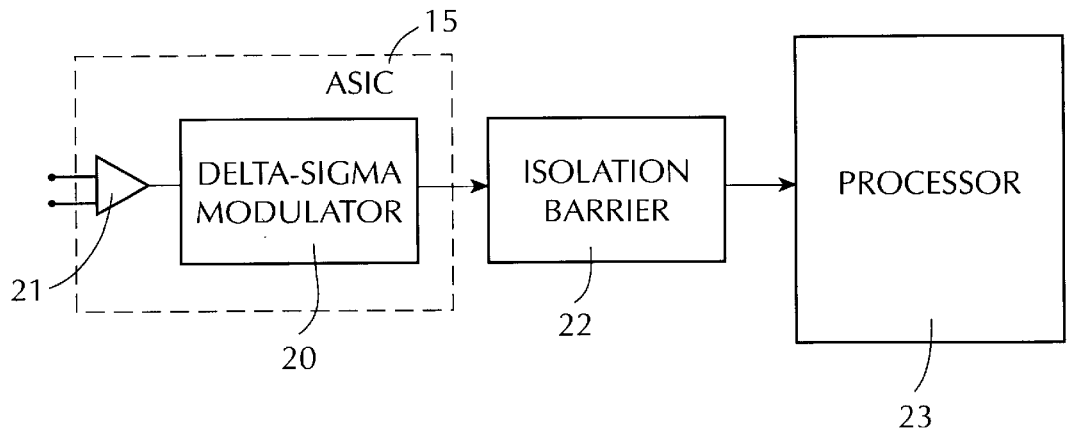
FIG. 4 is a block diagram of a simple form of an electronic circuit for the detector.

Turning now to FIG. 4, it will be seen that the main block within the ASIC 15 consists of a single delta-sigma modulator 20. There is also an analog input circuit which has its input terminals connected to the copper end portions 13. The output of the ASIC 15 in this case consists of a high frequency one-bit data signal train. In use, the ASIC output is connected via a transformer or other isolation barrier 22 to a processor 23. The processor in this arrangement is configured to carry out one or more decimation filtering operations to convert the one-bit signal stream into a multi-bit digital valve at a lower frequency.

The processor 23 may typically be configured to receive signals from a plurality of the detectors and to sum these signals to ascertain whether the current flows through the detectors are balanced. Such an arrangement can be used for residual current correction allowing an actuator to trip a switch if an unbalanced condition is found to exist.

The processor 23 may alternatively or additionally compare the instantaneous current level with a trip level so that overcurrent tripping can be controlled.

Figure 5:
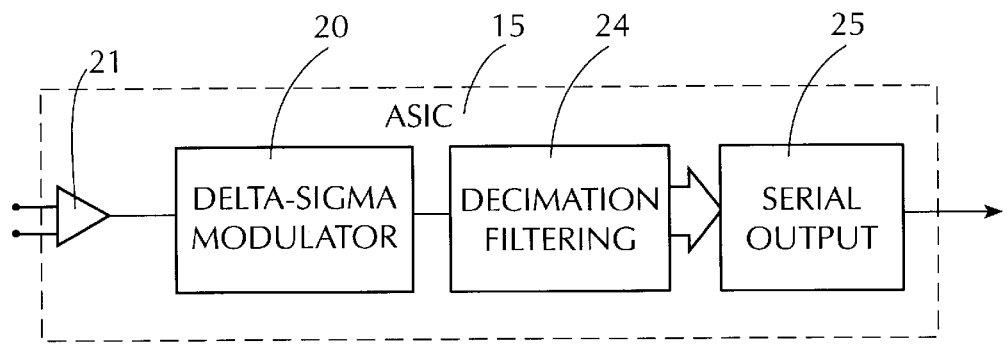
FIG. 5 and 6 are block diagrams of more complex forms of electronic circuits.

In the alternative embodiment shown in FIG. 5, the ASIC is more complex and includes one or more of the decimation filtration stages 24 and a serial output driver 25 to transmit the bits of the multi-bit digital signal produced by the filtration stage 24 serially to the processor. With this arrangement, the configuration of the processor can be simplified as part or all of the decimation filtration operation is carried out in the ASIC.

Figure 6:
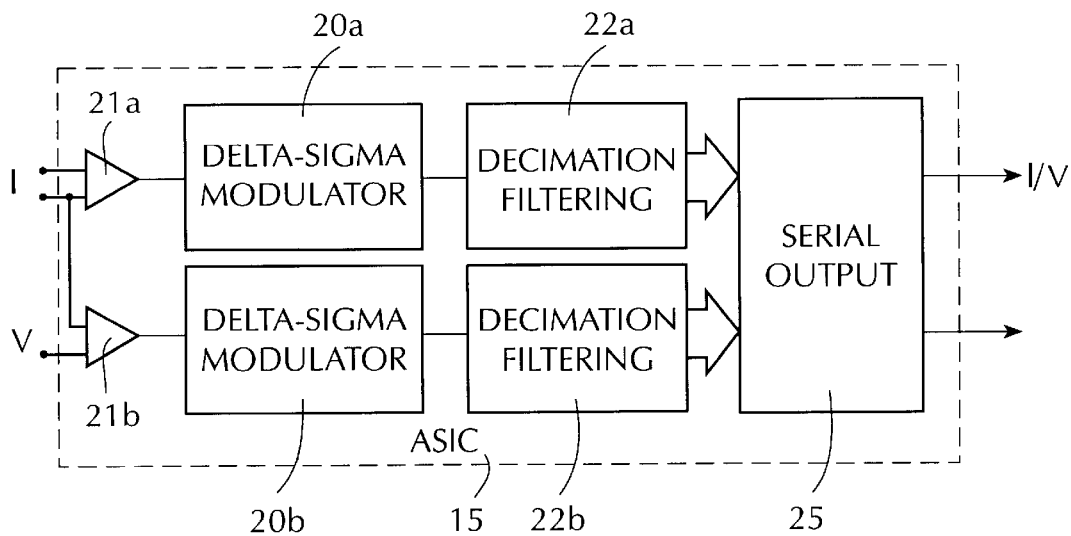

In the arrangement shown in FIG. 6 the ASIC has a further analog input which can be connected to a reference voltage source. Two analog input stages 21a and 21b are present and these feed signals to two independent delta-sigma modulators 20a, 20b. As shown, there are two independent decimation filtration stages 22a, 22b for the two one-bit digital signal streams. The outputs of the stages 22a, 22b may, as shown, be connected to a common serial output stage or (not shown) separate serial output stages may be provided.

It will be appreciated that the arrangement of FIG. 6 may be modified by the omission of the two filtration stages 22a, 22b where all filtration is to be carried out by the processor.

Where voltage as well as current is monitored by the processor, precise calibration of the shunts can be achieved. This allows more accurate determination of the current balance in residual current detection (RCD) applications. Moreover, as voltage and current are both being monitored to a high level of precision, accurate power consumption metering can be obtained.

Where the devices of the invention are used in RCD and overcurrent trip systems, the processor can be programmed to recognise the transients which may occur when loads are switched in and out of circuit to avoid false tripping. Many other convenient functions can be programmed into the processor, made possible by the high precision of the current measurements capable of being carried out.

What is claimed is:

1. A current sensor comprising a rigid metallic link member having two end portions of conductive material and an intermediate portion interconnecting the end portions, said intermediate portion being formed of a resistive material, and an integrated circuit analog to digital converter mounted on said link member, said converter having analog input terminals connected to respective ones of said two end portions and digital output terminals for connection to a processing apparatus.

2. A current sensor as claimed in claim 1 in which the converter is attached to the link member by means of a layer of electrically insulating adhesive.

3. A current sensor as claimed in claim 2 in which the converter is attached to the intermediate portion.

4. A current sensor as claimed in claim 3 in which the analog input terminals of the converter are connected to the end portions by means of wire bonds.

5. A current sensor as claimed in claim 1 in which the converter has a voltage reference terminal for connection to a reference voltage source and said converter operates to provide digital output signals representing the current through said intermediate portion and digital output signals representing the voltage on one of the end portions.

6. A current sensor as claimed in claim 1 in which said converter includes a delta-sigma modulator which provides a high frequency one-bit digital data stream.

7. A current sensor as claimed in claim 6 in which the converter also includes at least one decimation filter stage.

8. A current measurement apparatus including at least one current sensor as claimed in claim 1 and a processor circuit connected to receive and process digital signals received from said current sensor.

9. A current measurement apparatus as claimed in claim 8 in which the processor circuit is configured to carry out one or more decimation filtering operations on the received digital signals.

* * * * *